(12) United States Patent
Bruennert et al.

(10) Patent No.: US 8,116,157 B2
(45) Date of Patent: Feb. 14, 2012

(54) INTEGRATED CIRCUIT

(75) Inventors: Michael Bruennert, Munich (DE);
Harald Roth, Munich (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/943,202

(22) Filed: Nov. 20, 2007

(65) Prior Publication Data

US 2011/0080796 A1  Apr. 7, 2011

(51) Int. Cl.
*G11C 7/00* (2006.01)
(52) U.S. Cl. .................. 365/205; 365/185.15; 365/190
(58) Field of Classification Search .................. None
See application file for complete search history.

(56) References Cited

U.S. PATENT DOCUMENTS

| 4,872,142 | A | * | 10/1989 | Hannai | 365/189.07 |
| 5,278,799 | A | * | 1/1994 | Uesugi | 365/230.01 |
| 5,280,452 | A | * | 1/1994 | Dhong et al. | 365/205 |
| 6,407,946 | B2 | * | 6/2002 | Maruyama et al. | 365/185.2 |
| 6,920,074 | B2 | * | 7/2005 | Fischer et al. | 365/203 |
| 7,420,862 | B2 | * | 9/2008 | Hummler | 365/205 |

* cited by examiner

*Primary Examiner* — Tan T. Nguyen
(74) *Attorney, Agent, or Firm* — Dicke, Billig & Czaja, PLLC

(57) ABSTRACT

An integrated circuit is disclosed. One embodiment provides a sense amplifier; a first bit line; a second bit line. A first switch is configured to connect/disconnect the first bit line to/from the sense amplifier. A second switch is configured to connect/disconnect the second bit line to/from the sense amplifier independently from the first switch.

19 Claims, 7 Drawing Sheets

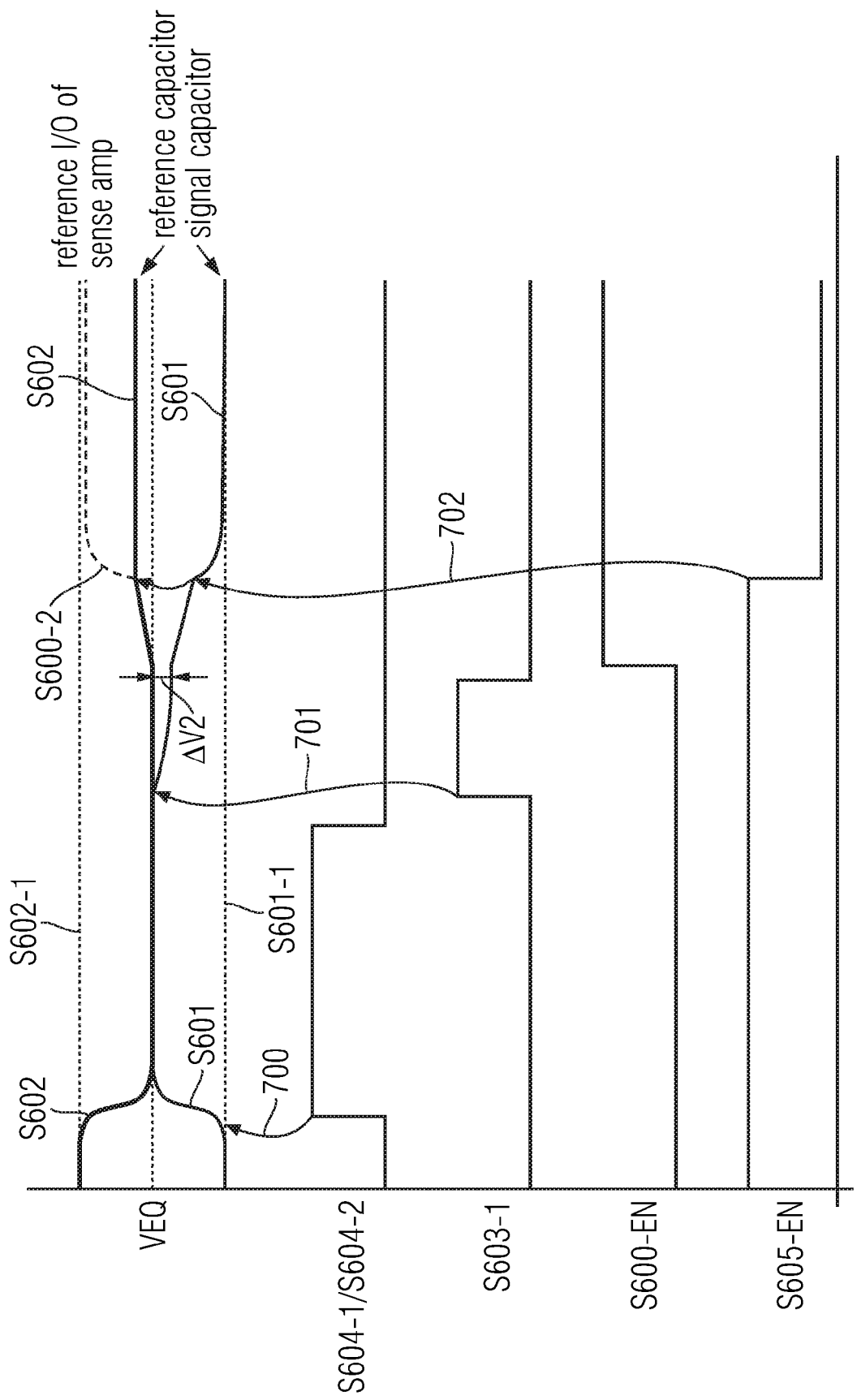

INTEGRATED CIRCUIT

BACKGROUND

One or more embodiments provide an integrated circuit. A further embodiment relates to a method for reading out a bit line of an integrated circuit.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 illustrates signals of an integrated circuit according to the embodiment of the integrated circuit of FIG. 6.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the following, embodiments of the invention are described. It should be noted that all embodiments described in the following may be combined in any way, i.e. there is no limitation that certain described embodiments may not be combined with others. Further, it should be noted that same reference signs throughout the Figures denote same or similar elements.

It should be noted that the principles explained in the following may be applied within a dynamic random access memory (DRAM), static RAM (S-RAM), floating body RAM (FB-RAM), thyristor RAM (T-RAM), ferro electric RAM (FE-RAM), magnetoresistive RAM (M-RAM), and phase change RAM (PC-RAM) architectures.

Figure 1:
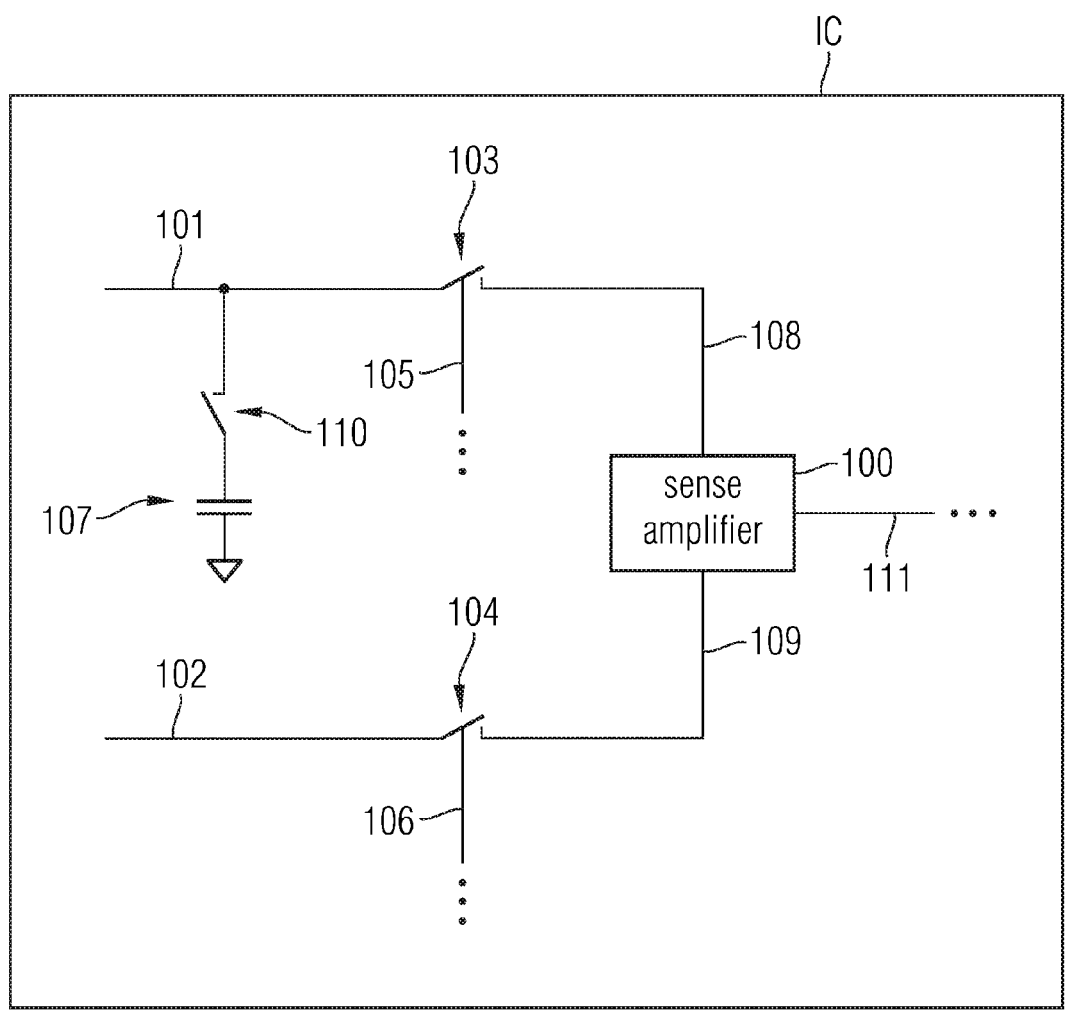
FIG. 1 illustrates an integrated circuit according to one embodiment.

In FIG. 1, an integrated circuit IC includes an amplifying means, e.g., a sense amplifier 100, a first bit line 101, a second bit line 102, a first switching means, e.g., a first switch 103, and a second switching means, e.g., a second switch 104. The first and second switches 103, 104 may be e.g., a transistor, e.g., an FET-transistor. The amplifying means may include one or more CMOS inverters, one or more operational amplifiers, and/or similar components. The amplifying means may further be a sense amplifying means as a positive feedback system/configuration. This means that the output may be connected to the input of the sense amplifying means and therefore the amplified signal is put back on first bit line 101 and/or second bit line 102.

Sense amplifier 100 is connectable in between the first and second bit lines 101, 102. The first bit line 101 may be connected to sense amplifier 100 by the first switch 103. The second bit line 102 may be connected to sense amplifier 100 via second switch 104. First and second switches 103, 104 may be controlled independently from each other. For example, first switch 103 may be connected and/or disconnected before and/or after connecting/disconnecting second switch 104.

In a further embodiment, integrated circuit IC may include a first signal line 105, and a second signal line 106, which respectively control the switching of first switch 103 and second switch 104. The first signal line 105 might be a first select signal line, and the second signal line 106 might be a second select signal line.

The first and second bit lines 101, 102 need not be adjacent bit lines of integrated circuit IC. In other words, it may be possible that further bit lines are arranged in between first and second bit lines 101, 102. In another embodiment, it is, however, possible that first and second bit lines 101, 102 are adjacent bit lines of an array. For example, first bit line 101 may be bit line number n, and second bit line 102 may be bit line number (n+1).

In a further embodiment, the second bit line 102 may be a reference bit line, and first bit line 101 may be connectable to a storage means, e.g., cell capacitor 107. A storage means may also be a latch in a SRAM architecture, a thyristor in a DRAM architecture, a capacitor in a FB-RAM architecture, and a controllable resistor in an M-/PC-/FE-RAM architecture.

It is not necessary that second bit line 102 is also connectable to a cell capacitor. Second bit line 102 may be any kind of conducting line configured to be charged to a first predetermined voltage level and, thus, serve as a reference bit line. In a further embodiment, second bit line 102, may, however, match the properties, e.g., capacity and/or resistance, of first bit line 101 to achieve good tracking between first bit line 101 (sense line) and second bit line 102 (reference line) to yield small deterministic errors.

In a further embodiment, the first and second switches 103, 104 may be controlled to connect the first and second bit lines 101, 102 to sense amplifier 100 essentially at the same time. Therefore, a respective first and second signal transmitted via first and second signal lines 105, 106 may be controlled such that first and second switches 103, 106 close substantially at the same time. In another embodiment, it may also be possible that first and second switches 103, 104 connect first and second bit lines 101, 102 at different times. However, first and second switches 103, 104 should connect first and second bit lines 101, 102 before a precharge signal of integrated circuit IC is disabled.

According to a further embodiment, first and second switches 103, 104 may be controlled to disconnect first and second bit lines 101, 102 at different times. For example, the second bit line 102 may be disconnected from sense amplifier 100 before the first bit line 101. Also, it may be possible that second bit line 102 is disconnected from sense amplifier 100 before a readout process of first bit line 101 is started.

In a further embodiment, second bit line 102 may be disconnected from the sense amplifier 100 after a sensing operation of the sense amplifier has started. The sensing operation of sense amplifier 100 may be started by activating a respective sense enable signal. Thus, in this embodiment second switch 104 may be controlled to disconnect second bit line 102 from sense amplifier 100 after the sense enable signal is activated.

In a further embodiment, second bit line 102 may be disconnected from sense amplifier 100 shortly after the start of the sensing operation. In other words, in this embodiment, second switch 104 may be controlled to disconnect second bit line 102 from sense amplifier 100 shortly after a respective sense enable signal has been activated.

After the first and second switches 103, 106 have been closed, i.e. first and second bit lines 101, 102 are connected to sense amplifier 100, sensing of first and second bit lines 101, 102 starts at first and second inputs 108, 109 of sense amplifier 100. In one embodiment, prior to connecting first and second bit lines 101, 102 to sense amplifier 100, the first and second bit lines 101, 102 may be precharged to a first predetermined voltage level e.g., by activating a respective precharge signal 205. The first predetermined voltage level, in the following also referred to as vbleq (=voltage bit line equalization), may lie between a second and third predetermined voltage level. The second predetermined voltage level may correspond to the logic state "high", and may in the following also be referred to as vblh (=voltage bit line high). The third predetermined voltage level may correspond to the logic state "low", and may in the following also be referred to as zero. The second and third predetermined voltage levels may also be referred to as rails. It may be possible that third predetermined voltage level is, thus, equal to zero, and second predetermined voltage level is equal to 2.5 V. The first predetermined voltage level may be essentially equal to half of the second predetermined voltage level, e.g., the first predetermined voltage level may, thus, be equal to 1.25 V.

After closing first and second switches 103, 104, the voltages at first and second inputs 108, 109 of sense amplifier 100 are set to the first predetermined voltage level (due to precharge signal being active and switches 103, 104 being closed). After this, and after removing the precharge condition (precharge signal disabled) cell switch 110 configured to connect cell capacitor 107 to first bit line 101 may be closed. Thus, a charge of cell capacitor 107 may start to influence the voltage level of first bit line 101. Thereafter, sense amplifier 100 may be enabled via a sense enable signal 111. Upon enabling sense amplifier 100, sense amplifier 100 may start to influence the voltage level at first and second inputs 108, 109 "inversely". Thus, if the voltage level at first input 108 is rising, then voltage level at second input 109 is falling and vice versa.

However, as indicated above, in one embodiment, after the sense amplifier has been enabled, second switch 104 is controlled to disconnect second bit line 102 from sense amplifier 100. In other words, second switch 104 may be opened after sense amplifier 100 has been enabled and, consequently, the voltage level of second bit line 102 is not influenced anymore by sense amplifier 100. If second switch 104 remained closed, then sense amplifier 100 would need to provide power to influence the voltage level of second bit line 102. Since, however, switch 104 may be opened, this is not the case and, therefore, power may be saved.

Figure 2:
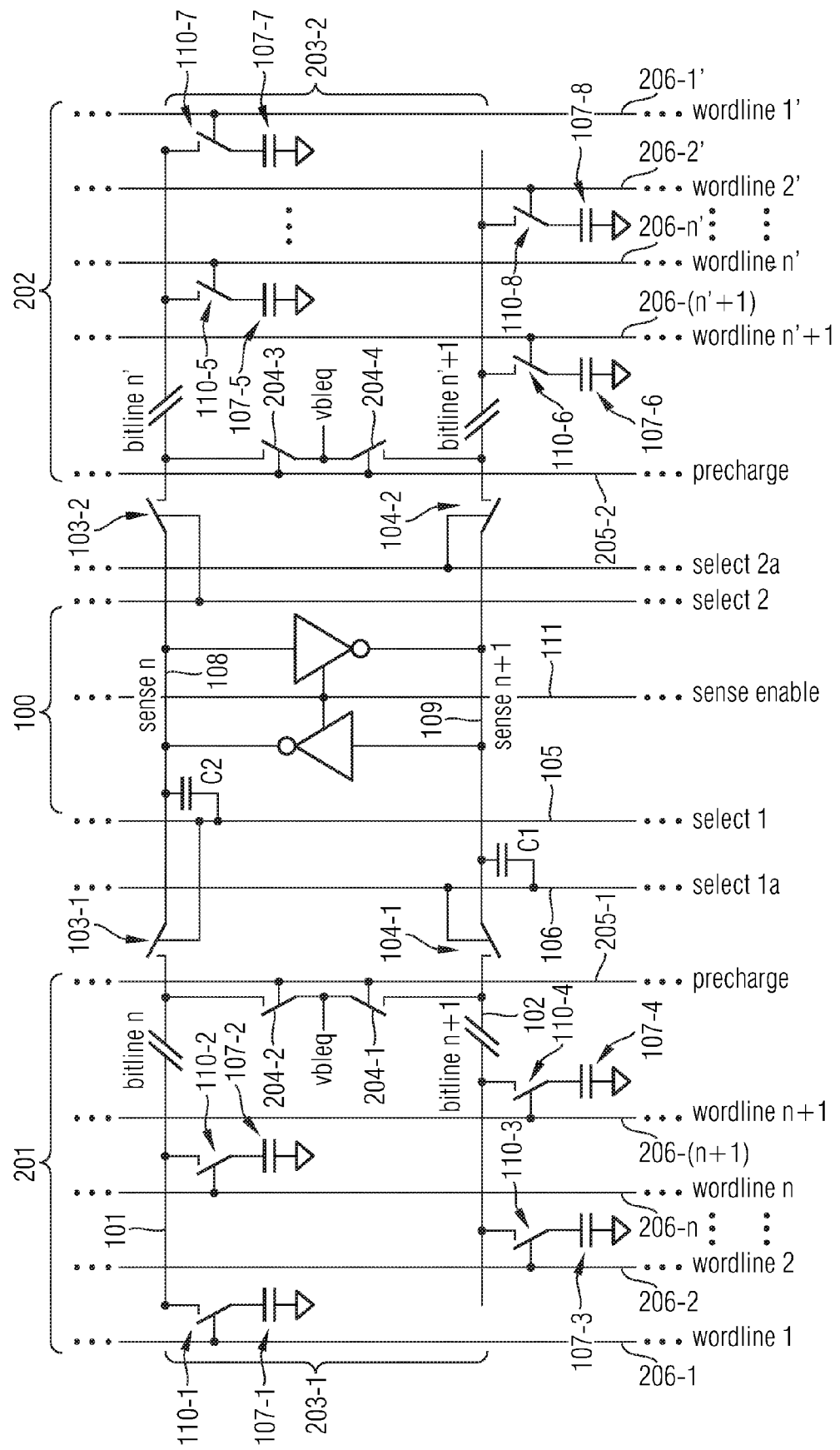
FIG. 2 illustrates a further embodiment of an integrated circuit according to a further embodiment.

FIG. 2 illustrates a part 200 of an array of a memory. Part 200 of the array may include first and second bit line segments 201, 202. There may be different architectures of the array. The architecture of the array illustrated in FIG. 2 allows using sense amplifier 100 for first bit line segment 201 or for second bit line segment 202. In one embodiment the usage of sense amplifier 100 for first bit line segment 201 or for second bit line segment 202 may be mutually exclusive. In this embodiment, switch 103-1 should not be closed at the same time as switch 103-2. Similarly, switch 104-1 should not be closed at the same time as switch 104-2.

Part 200 of the array also includes a bit line pair 203-1, 203-2. A bit line pair 203 includes adjacent bit lines n and n+1.

In the following, without any limitation, it is assumed that a readout process of cell capacitors 107-1, 107-2 of the first bit line 101 takes place. Thus, the second bit line 102 (bit line n+1) is the reference bit line of the first bit line 101.

Figure 3:
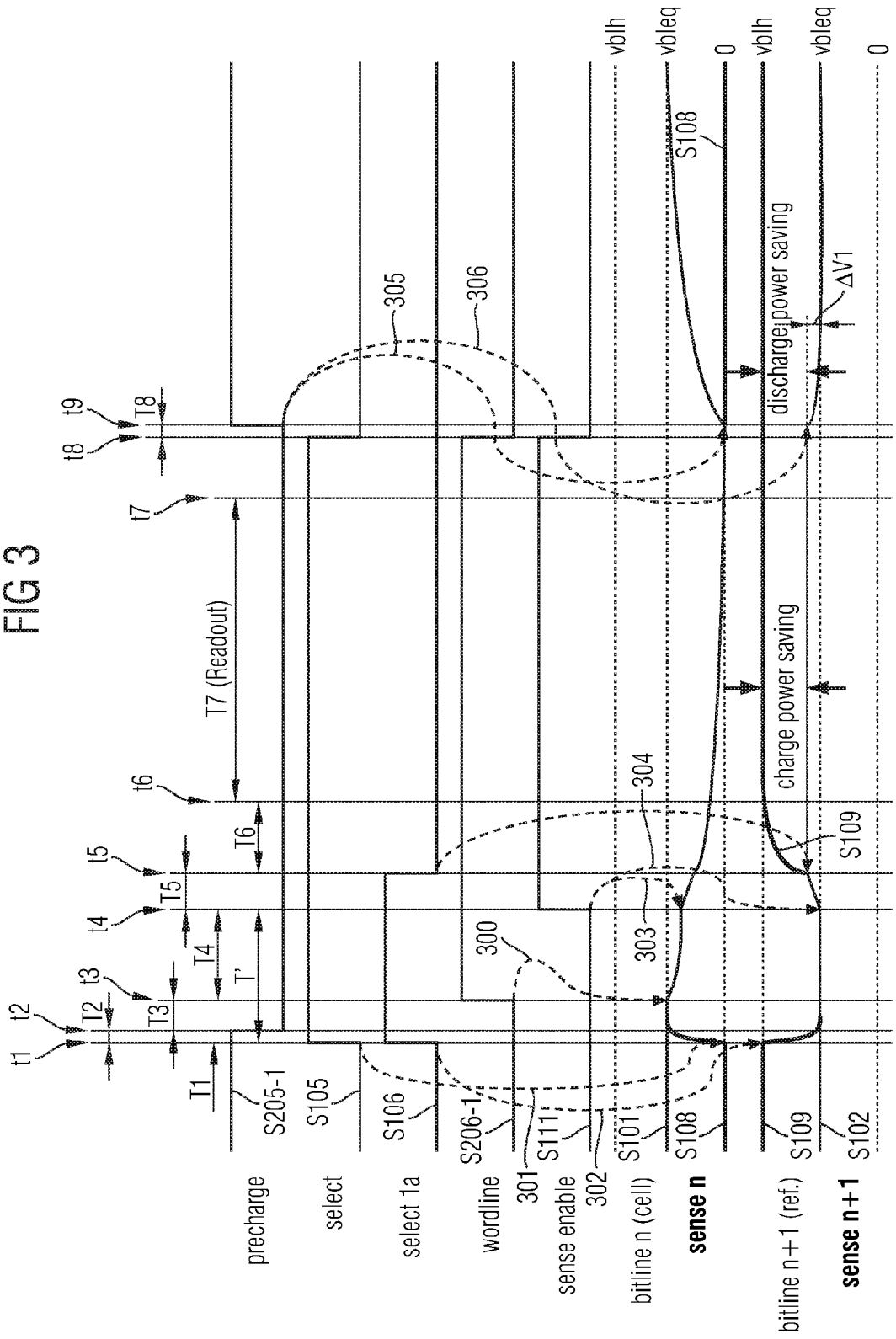
FIG. 3 illustrates signals of an integrated circuit according to the embodiment of the integrated circuit of FIG. 2.

Before reading out first bit line 101 starts, first bit line 101 and second bit line 102 (reference bit line) are set to have essentially a same voltage level, i.e. a first predetermined voltage level vbleq (see also FIG. 3). This is done by controlling switches 204-1, 204-2 via precharge signal line 205-1. In other words, first and second bit lines 101, 102 are set to vbleq by closing switches 204-1, 204-2.

In the following, the functioning of the circuit illustrated in FIG. 2 will be explained at hand of FIG. 3. The reference signs starting with "S" and followed by a number denote the signal present on the respectively denoted signal line of FIG. 2. For example, reference sign S205-1 in FIG. 3 denotes the signal on signal line 205-1 of FIG. 2.

As can be seen, during a first period of time T1 precharge signal S205-1 is enabled. Thus, during first period of time T1 the voltage level of signals S101, S102 of first and second bit lines 101, 102 are set to essentially the same first predetermined voltage level vbleq. At a first moment in time t1, select signals S105, S106 controlling first and second switches 103-1, 104-1 are set to high level. Therefore, signals S108, S109 corresponding to signal lines 108, 109 of FIG. 2 are also set to the same first predetermined voltage level vbleq as denoted by arrows 301, 302: As can be seen, signals S108, S109 rise/fall to the first predetermined voltage level vbleq during a further period of time T2. At second moment in time t2, precharge signal S205-1 is disabled, i.e. set to "low". Shortly after, at moment in time t3, the word line is activated, i.e. signal S206-1 on word line 206-1 is enabled (without limitation, in the following, reading out of word line 206-1 of FIG. 2 is described. Reading out of other word lines 206-2, 206-n, 206-(n+1) may be done in the same or similar way).

By activating the word line 206-1 via signal S206-1, the charge on cell capacitor 107-1 starts influencing the voltage on first bit line S101 as indicated by arrow 300 in FIG. 3. In the example of FIG. 3, without any limitation to this case, it is assumed that cell capacitor 107-1 was at a low level. Therefore, during period of time T4, the voltage level of signal S101 starts decreasing.

At moment in time t4, sensing starts by enabling sense signal S111. Therefore, during period of time T5, the voltage of signal S101 on the first bit line 101 starts decreasing and the voltage of signal S102 on second bit line 102 starts increasing, as indicated by arrows 303, 304.

At moment in time t5, i.e. shortly after starting sensing at t4, second switch 104-1 is opened, i.e. reference bit line 102 is disconnected from sense amplifier 100 by setting signal S106 to a low level.

This in turn stops signal S102, i.e. the voltage on reference bit line 102, from further increasing. Thus, sense amplifier 100 need not to provide further power to drive the voltage on reference bit line 102 to a high level (second predetermined voltage level vblh). Thus, power is saved compared to a situation where signal S106 would stay on "high" for a longer period of time, i.e. second switch 104-1 would remain closed for a longer period of time, e.g., until a readout of the bit line has occurred.

As can bee seen from FIG. 3, after disconnecting the second bit line 102 from sense amplifier 100 by opening second switch 104, the voltage level stays the same (signal S102 from time t5 to t9 is at a same level). Thus, the known Miller-effect may not occur.

Further, as can be seen during period of time T6, the voltage of signal S101, i.e. the voltage of first bit line 101, starts decreasing more rapidly than before, e.g., during period of time T5. The reason for this may be, that on second input 109 input of sense amplifier 100 there is a much lower capacitance after disconnecting second bit line 102, and therefore signal S109 changes more quickly. This in turn may give a larger input voltage for the sense amp increasing the driving capability for the signal on first input 108/first bit line 101, and, consequently, these signals move faster as well. Thus, the voltage level on first bit line 101 decreases to a low level faster compared to a situation where second switch 104-1 would remain closed. Thus, a readout process of the bit line may start earlier (a readout process may not start before the voltage level on first bit line 101 is stable, e.g., below/above a predefined threshold). As illustrated in FIG. 3, the readout process may already start at t6.

After the readout process is finished, at time t8, signals S105, S206-1, and S111 are again set to a low level. Shortly after, at time t9, the precharge signal S205-1 is enabled again, which in turn leads to first and second bit lines 101, 102 to take on the first predetermined voltage level vbleq as indicated by arrows 305, 306.

If the second switch 104-1 would not exist, then, in the example of FIG. 3, the voltage level of second bit line 102 would raise to the second predetermined voltage level vblh. Thus, after enabling the precharge signal S205-1, a large amount of power would be needed to discharge the reference bit line 102. However, since the voltage on reference bit line 102 remained at a constant level from time t4 to t9, less power is needed to discharge the reference bit line 102. As can be seen from FIG. 3, the voltage on reference bit line 102 need only be reduced very little by ΔV1.

It should also be noted that due to the fact that the voltage on second bit line 102 only varies very little and stays in the vicinity of the first predetermined voltage level vbleq during the whole readout process of bit line 101, there will be less noise or other side effects induced that would occur if the voltage of reference bit line 102 would vary more.

As is clear from the diagram of FIG. 3, second bit line 102 is disconnected from sense amplifier 100 before first bit line 101, i.e. second bit line 102 is disconnected from sense amplifier 100 at t5. Further, as can also be seen from FIG. 3, second bit line 102 is, thus, disconnected from sense amplifier 100 before a readout process of the first bit line, which in the diagram of FIG. 3 starts at t6.

FIG. 3 also illustrates that the second bit line is disconnected from the sense amplifier 100 after a sensing operation of the sense amplifier has started, which in the diagram of FIG. 3 is at t=t4.

Also, it can be seen from FIG. 3 that the second bit line is disconnected from sense amplifier 100 a first period of time T5 after the start of the sensing operation at t4. The first period of time T5 is thereby shorter than a second period time T'. Second period of time T' starts when second switch 103-1 is connected to sense amplifier 100 and ends at the start of sensing, i.e. at t=t4. As the, first and second switches 103-1, 104-1 may be operated (connected/disconnected) independently from each other. Second period of time T' may start when first switch 103-1 or second switch 104-1 may close, i.e. connect first bit line 101 and/or second bit line 102.

Thus, second bit line 102 may be disconnected from sense amplifier 100 a predetermined period of time T5 after the start of a sensing operation. First period of time T5 may depend on effects due to controlling of the switches. Such effects may e.g., be parasitic effects, e.g., due to a capacities C1, C2 between first and second select lines 105, 106 and first and second bit lines 101, 102, and first and second inputs 108, 109, respectively. Capacities C1, C2 may couple the switching signals S105, S106, which may have a rather large amplitude onto the first and/or second bit line(s) 101, 102 may having rather weak signals and may thus be sensitive. Parasitic effects may also be induced by a capacity of the first and/or second bit line(s) 101, 102.

In general, period of time T5 should be long enough to be able to open second switch 104 without influencing a result of the readout process. Therefore, the absolute value of the difference of voltage on first input line 108 and voltage on second input line 109 should be larger than a predefined threshold. In other words, |S108-S109| should be larger than a predefined threshold.

Figure 4:
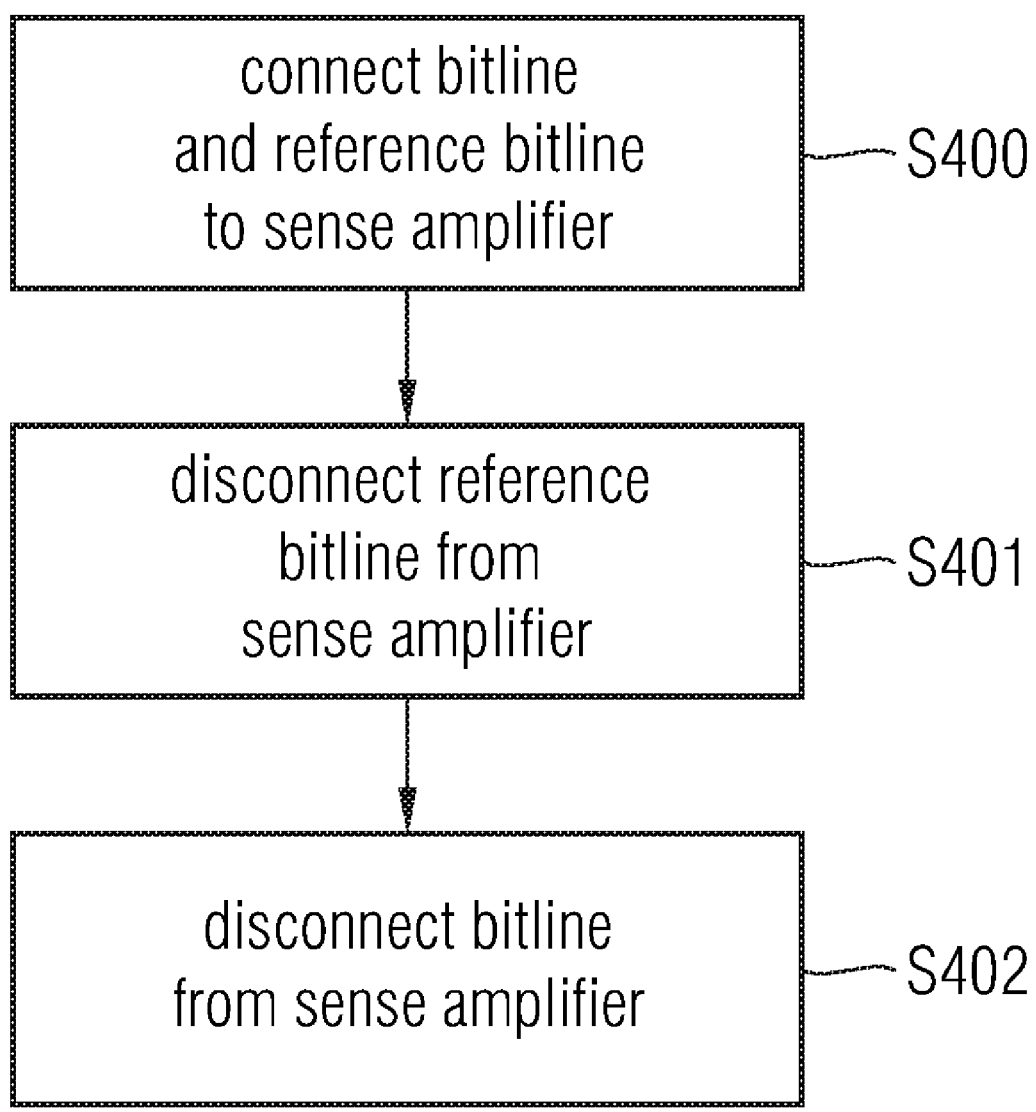
FIG. 4 illustrates a flow chart of a method for reading out a bit line according to a further embodiment.

FIG. 4 illustrates processes of a further embodiment. This embodiment provides a method for reading out a bit line. Without any limitation, for the following description it is assumed that this is first bit line 101 of FIGS. 1 to 3, and the circuit of FIG. 1 or 2 is used for reading out.

In step S400, the first bit line 101, and reference bit line 102 may, thus be connected to sense amplifier 100. Then, in step S401, reference bit line 102 may be disconnected from sense amplifier 100.

Further, in step S402, bit line 101 is disconnected from sense amplifier 100.

In the embodiment of FIG. 4, the reference bit line is, thus, disconnected from the sense amplifier prior to the bit line. Thus, the disconnecting of the bit lines is controlled independently from each other.

Figure 5:
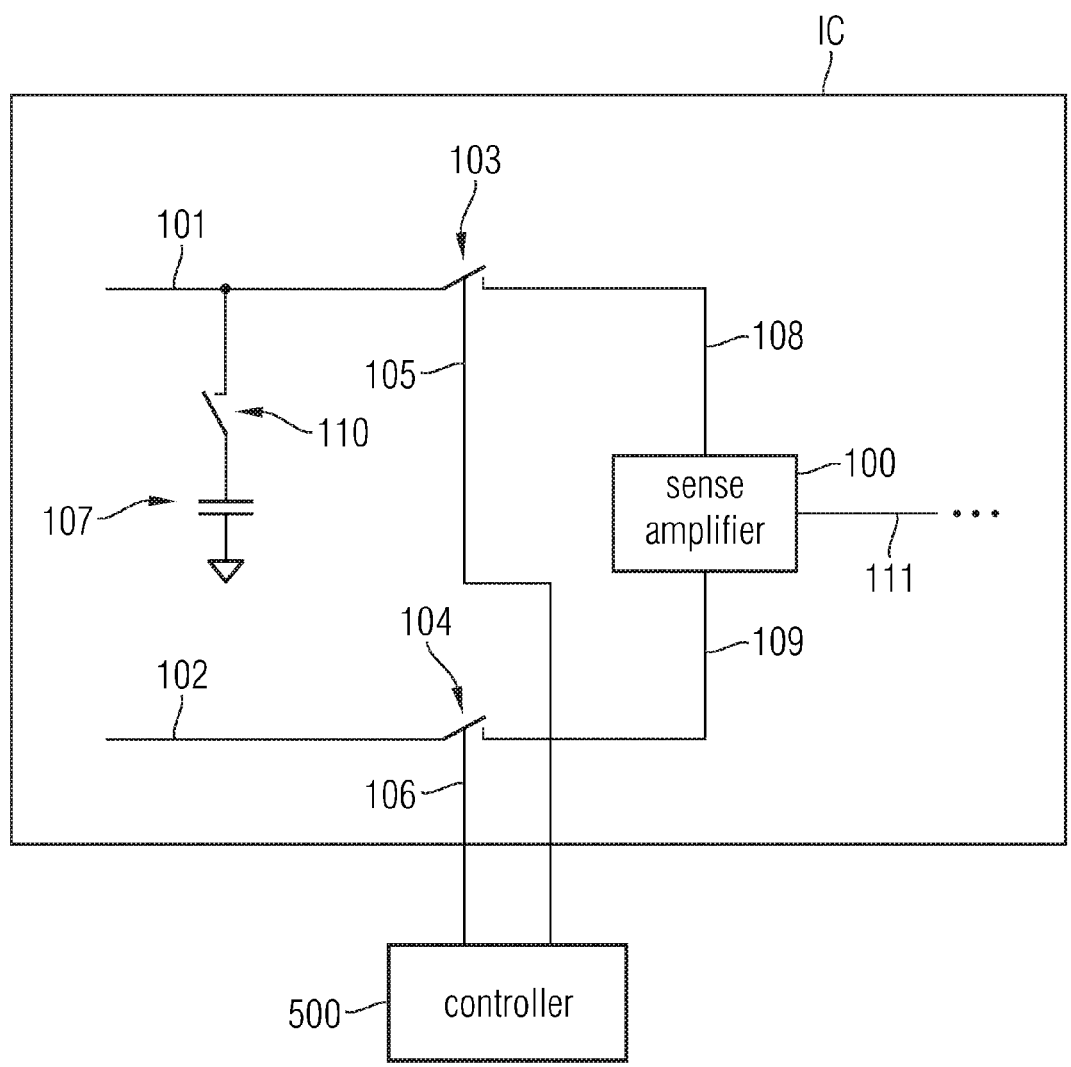
FIG. 5 illustrates a memory system according to a further embodiment.

FIG. 5 illustrates a further embodiment, where a controller 500 provides signals transmitted via first and second signal lines 105, 106 to control first and second switches 103, 104.

Figure 6:
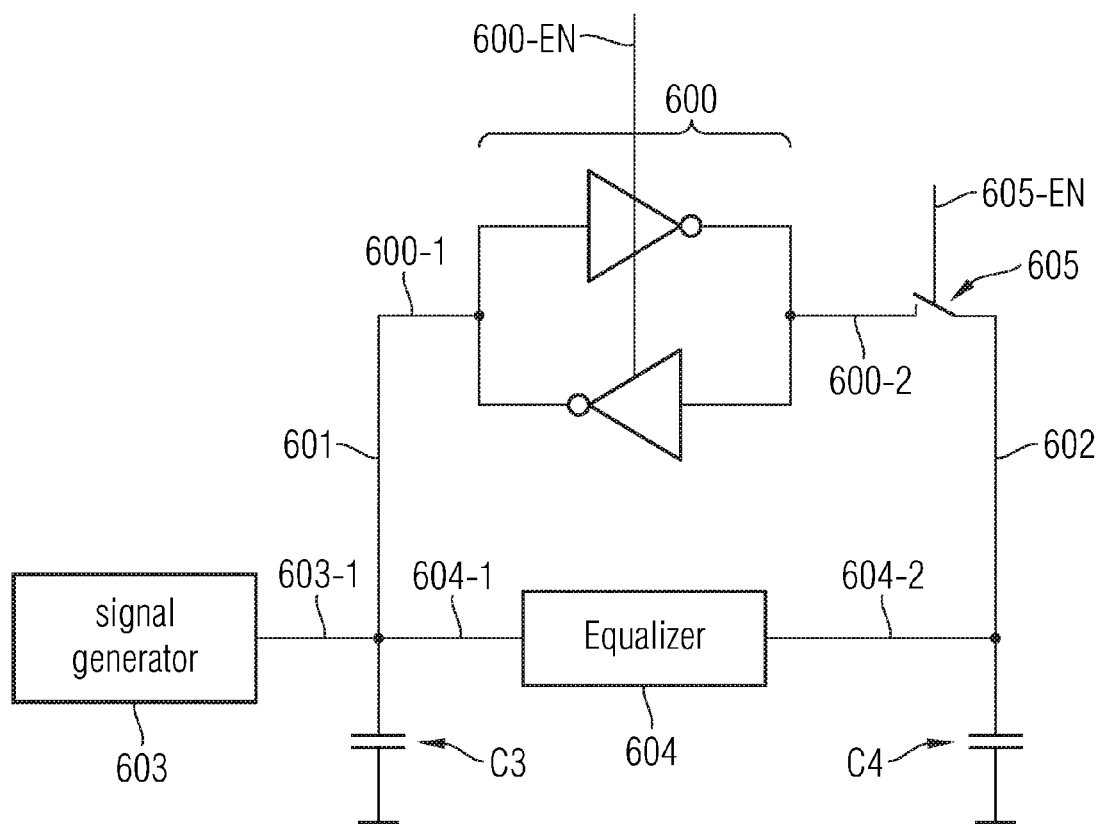
FIG. 6 illustrates an integrated circuit according to a further embodiment.

A further embodiment illustrated in FIG. 6 incudes a sense amplifier 600 with positive and negative in/outputs 600-1, 600-2 connected to first and second signal lines 601, 602. Sense amplifier may be controlled via sense enable signal 600-EN. First signal line 601 is connected to a first circuit 603, e.g., a signal source, to a capacitive element C3, and to an equalizer 604. Second signal line 602 is connected to a further capacitive element C4 which essentially models the properties of first signal line 601 and may thus be considered as a second circuit or replica circuit. Capacitive elements C3, C4 may essentially be identical. Second signal line 602 is also connected to equalizer 604. Capacitive element C3 on the signal generator side may be part of first circuit 603, whereas capacitive element C4 on the other side (also referred to as reference side) may be a replica of the generator side capacitive element C3.

As can be seen, second signal line 602 may be connected/disconnected to/from the sense amplifier 600 via a switch 605.

The system may work in a time discrete manner as depicted in FIG. 7. At the beginning of the cycle equalizer 604 (equalizing element) sets an equal voltage VEQ on capacitive element C3 and further capacitive element C4 as indicated by arrow 700 in FIG. 7. Then the signal source 603 adds/subtracts a small signal S603-1 to be sensed to reference voltage stored on signal capacitive element C3 as indicated by arrow 701. Therefore a voltage difference ΔV2 evolves between the signal and the reference voltage. This voltage difference ΔV2 is amplified by turning on the sense amplifier via sense enable signal S600-EN towards the supply rails S601-1, S602-1, enabling a digital decision, if the sense voltage was positive or negative. By opening switch 605 (via switch enable signal S605-EN) between sense amplifier 600 and reference capacitive element C4 shortly after sense amplifier 600 had been enabled, charging the reference capacitive element C4 to the full supply rail voltage S602-1 can be avoided to save energy. Further, the voltage of first signal line 601, i.e. signal S601, starts moving towards rail S601-1 faster than before as indicated by arrow 702 in FIG. 7.

Circuits like the one depicted in FIG. 7 may occur e.g., in laser fuse readout circuits, comparators in ADCs or receivers for binary signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit, comprising:
   a sense amplifier;
   a first bit line,
   a second bit line;
   a first switch configured to connect/disconnect the first bit line to/from the sense amplifier; and
   a second switch configured to connect/disconnect the second bit line to/from the sense amplifier independently from the first switch;
   wherein the first and second switches are controlled to disconnect the first and second bit lines from the sense amplifier at different times, and
   wherein the first and second switches are controlled to connect the first and second bit lines to the sense amplifier essentially at a same time.

2. An integrated circuit, comprising:
   a sense amplifier;
   a first bit line;
   a second bit line;
   a first switch configured to connect/disconnect the first bit line to/from the sense amplifier; and
   a second switch configured to connect/disconnect the second bit line to/from the sense amplifier independently from the first switch,
   wherein the first and second switches are controlled to disconnect the first and second bit lines from the sense amplifier at different times,
   wherein the second bit line is disconnected from the sense amplifier before a read-out process of the first bit line, and
   wherein the second bit line is disconnected from the sense amplifier after a sensing operation of the sense amplifier has started.

3. The integrated circuit of claim 2, wherein the first and second switches are controllable by a first and second select signal, respectively.

4. The integrated circuit of claim 2, wherein the second bit line is a reference bit line for the first bit line.

5. The integrated circuit of claim 2, wherein the second bit line is disconnected from the sense amplifier before the first bit line.

6. The integrated circuit of claim 2, wherein the second bit line is disconnected from the sense amplifier a first period of time after a start of the sensing operation, which first period of time is shorter than a second period of time which starts when the first switch and/or second switch is connected to the sense amplifier and ends at when the sensing operation starts.

7. The integrated circuit of claim 2, wherein the first and second select signals depend on signals provided by a controller.

8. The integrated circuit of claim 2, comprising a controlling unit configured to provide control signals based on which the first and/or second switches are controllable.

9. An integrated circuit, comprising:
   a sense amplifier;
   a first bit line,
   a second bit line;
   a first switch configured to connect/disconnect the first bit line to/from the sense amplifier; and
   a second switch configured to connect/disconnect the second bit line to/from the sense amplifier independently from the first switch,
   wherein the first and second switches are controlled to disconnect the first and second bit lines from the sense amplifier at different times,
   wherein the second bit line is disconnected from the sense amplifier before a read-out process of the first bit line, and
   wherein the second bit line is disconnected from the sense amplifier a predetermined period of time after a sensing operation of the sense amplifier has started, which predetermined period of time depends on effects due to controlling of the first and/or second switch.

10. An integrated circuit, comprising:
    a sense amplifier;
    a bit line;
    a reference bit line for the bit line;
    a first select signal line configured to connect/disconnect the bit line to the sense amplifier; and
    a second select signal line configured to connect/disconnect the reference bit line to the sense amplifier, wherein the first and second select signal lines are controlled to connect/disconnect the corresponding bit line and reference bit line to the sense amplifier at different times.

11. A method for operating an integrated circuit, comprising:
    connecting a bit line and a reference bit line for the bit line to a sense amplifier; and
    disconnecting the bit line and the reference bit line from the sense amplifier, wherein the reference bit line is disconnected from the sense amplifier prior to the bit line.

12. The method of claim 11, comprising connecting the bit line and the reference bit line to the sense amplifier essentially at a same time.

13. The method of claim 12, comprising disconnecting the bit line and the reference bit line from the sense amplifier at different times.

14. The method of claim 13, comprising disconnecting the reference bit line from the sense amplifier before the bit line.

15. The method of claim 14, comprising disconnecting the reference bit line from the sense amplifier before reading out the bit line.

16. The method of claim 15, comprising disconnecting the reference bit line from the sense amplifier after a sensing operation of the sense amplifier has started.

17. The method of claim 16, comprising disconnecting the reference bit line from the sense amplifier a first period of time after a start of the sensing operation, which first period of time is shorter than a second period of time which starts when the first switch and/or second switch is connected to the sense amplifier and ends at when the sensing operation starts.

18. The method of claim 15, comprising disconnecting the reference bit line from the sense amplifier a predetermined period of time after a sensing operation of the sense amplifier has started, which predetermined period of time depends on effects due to connecting/disconnecting the bit line and/or the reference bit line.

19. The method of claim 11, comprising connecting and/or disconnecting is controlled by a controller.

* * * * *